United States Patent
Slovin et al.

(10) Patent No.: US 10,461,253 B1
(45) Date of Patent: Oct. 29, 2019

(54) HIGH RELIABILITY RF SWITCH BASED ON PHASE-CHANGE MATERIAL

(71) Applicant: Newport Fab, LLC, Newport Beach, CA (US)

(72) Inventors: Gregory P. Slovin, Irvine, CA (US); David J. Howard, Irvine, CA (US); Jefferson E. Rose, Hawthorne, CA (US); Michael J. DeBar, Tustin, CA (US); Nabil El-Hinnawy, Irvine, CA (US)

(73) Assignee: Newport Fab, LLC, Newport Beach, CA (US)

( * ) Notice: Subject to any disclaimer, the term of this patent is extended or adjusted under 35 U.S.C. 154(b) by 0 days.

(21) Appl. No.: 16/103,587

(22) Filed: Aug. 14, 2018

(51) Int. Cl.
*H01L 45/00* (2006.01)

(52) U.S. Cl.
CPC .......... *H01L 45/1286* (2013.01); *H01L 45/06* (2013.01); *H01L 45/1226* (2013.01); *H01L 45/143* (2013.01); *H01L 45/144* (2013.01)

(58) Field of Classification Search
CPC .. H01L 45/06; H01L 45/1226; H01L 45/1286
See application file for complete search history.

(56) References Cited

U.S. PATENT DOCUMENTS

| | | | |
|---|---|---|---|
| 5,976,932 | A | 11/1999 | Kerber |
| 6,448,576 | B1 | 9/2002 | Davis |
| 9,257,647 | B2 * | 2/2016 | Borodulin ............. H01L 45/126 |
| 9,368,720 | B1 * | 6/2016 | Moon ................. H01L 45/1286 |
| 9,640,759 | B1 | 5/2017 | Curioni |
| 9,917,104 | B1 | 3/2018 | Roizin |
| 2006/0246712 | A1 | 11/2006 | Kim |
| 2007/0075347 | A1 | 4/2007 | Lai |
| 2013/0187120 | A1 | 7/2013 | Redaelli |
| 2013/0285000 | A1 | 10/2013 | Arai |
| 2014/0264230 | A1 | 9/2014 | Borodulin |
| 2015/0090949 | A1 | 4/2015 | Chang |
| 2016/0035973 | A1 | 2/2016 | Raieszadeh |
| 2016/0071653 | A1 | 3/2016 | Lamorey |

(Continued)

FOREIGN PATENT DOCUMENTS

WO    WO 2016/028362    2/2016

OTHER PUBLICATIONS

G. Slovin, et al. "AlN Barriers for Capacitance Reduction in Phase-Change RF Switches," in *IEEE Electron Device Letters*, vol. 37, No. 5, pp. 568-571, May 2016.

(Continued)

*Primary Examiner* — Allison Bernstein
(74) *Attorney, Agent, or Firm* — Farjami & Farjami LLP

(57) ABSTRACT

A radio frequency (RF) switch includes a heating element, a nugget, a phase-change material (PCM), and input/output contacts. The nugget comprises thermally conductive and electrically insulating material, and is situated on top of the heating element. The PCM has an active segment approximately situated over the nugget, and passive segments approximately situated under the input/output contacts. The PCM RF switch may include thermally resistive material adjacent to first and second sides of the heating element, and/or adjacent to first and second sides of the nugget. The PCM RF switch may include a heat valve under the heating element.

15 Claims, 15 Drawing Sheets

(56) References Cited

U.S. PATENT DOCUMENTS

2017/0092694 A1    3/2017   BrightSky
2017/0365427 A1   12/2017   Borodulin
2018/0005786 A1*   1/2018   Navarro ................. H01H 37/34
2018/0269393 A1    9/2018   Zhang
2019/0064555 A1    2/2019   Hosseini
2019/0067572 A1    2/2019   Tsai

OTHER PUBLICATIONS

G. Slovin, et al., "Design Criteria in Sizing Phase-Change RF Switches," in *IEEE Transactions on Microwave Theory and Techniques*, vol. 65, No. 11, pp. 4531-4540, Nov. 2017.

N. El-Hinnawy et al., "A 7.3 THz Cut-Off Frequency, Inline, Chalcogenide Phase-Change RF Switch Using an Independent Resistive Heater for Thermal Actuation," *2013 IEEE Compound Semiconductor Integrated Circuit Symposium* (*CSICS*), Monterey, CA, 2013, pp. 1-4.

\* cited by examiner

HIGH RELIABILITY RF SWITCH BASED ON PHASE-CHANGE MATERIAL

RELATED APPLICATION(S)

The present application is related to U.S. patent application Ser. No. 16/103,490, filed on Aug. 14, 2018, and titled "Manufacturing RF Switch Based on Phase-Change Material," and U.S. patent application Ser. No. 16/103,646, filed on Aug. 14, 2018, and titled "PCM RF Switch Fabrication with Subtractively Formed Heater." The disclosures of these related applications are hereby incorporated fully by reference into the present application.

BACKGROUND

Phase-change materials (PCM) are capable of transforming from a crystalline phase to an amorphous phase. These two solid phases exhibit differences in electrical properties, and semiconductor devices can advantageously exploit these differences. Given the ever-increasing reliance on radio frequency (RF) communication, there is particular need for RF switching devices to exploit phase-change materials. However, the capability of phase-change materials for phase transformation depends heavily on how they are exposed to thermal energy and how they are allowed to release thermal energy. For example, in order to transform into an amorphous state, phase-change materials may need to achieve temperatures of approximately seven hundred degrees Celsius (700° C.) or more, and may need to cool down within hundreds of nanoseconds. This presents a particular challenge for switching devices to prevent degradation due to high thermal energy while achieving fast switching times. Conventional PCM switches may fail to heat or cool fast enough for certain applications. Further other neighboring and sensitive semiconductor structures and components may be undesirably heated or suffer consequences from thermal cycling.

Additionally, the ongoing need for miniaturization introduces upper limits on driving voltages as well as overall device dimensions, often creating tradeoffs with parasitics associated with RF frequencies and resulting in performance tradeoffs. Accordingly, accommodating phase-change materials in RF switches can present significant design challenges.

Thus, there is a need in the art for a reliable low voltage and low parasitics phase-change material RF switches.

SUMMARY

The present disclosure is directed to designs for a high reliability radio frequency (RF) switch based on phase-change material (PCM), substantially as shown in and/or described in connection with at least one of the figures, and as set forth in the claims.

DETAILED DESCRIPTION

Figure 1A:
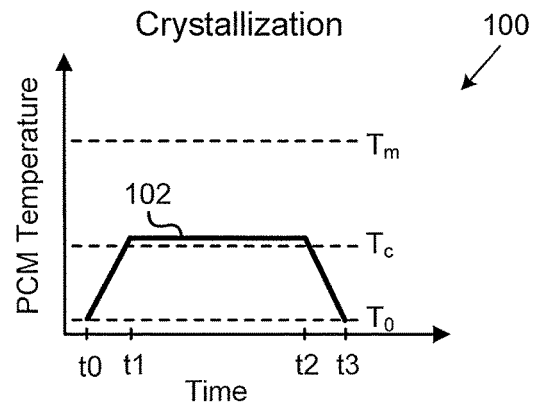
FIG. 1A illustrates an exemplary graph of phase-change material (PCM) temperature versus time according to one implementation of the present application.

The following description contains specific information pertaining to implementations in the present disclosure. The drawings in the present application and their accompanying detailed description are directed to merely exemplary implementations. Unless noted otherwise, like or corresponding elements among the figures may be indicated by like or corresponding reference numerals. Moreover, the drawings and illustrations in the present application are generally not to scale, and are not intended to correspond to actual relative dimensions.

Figure 1B:
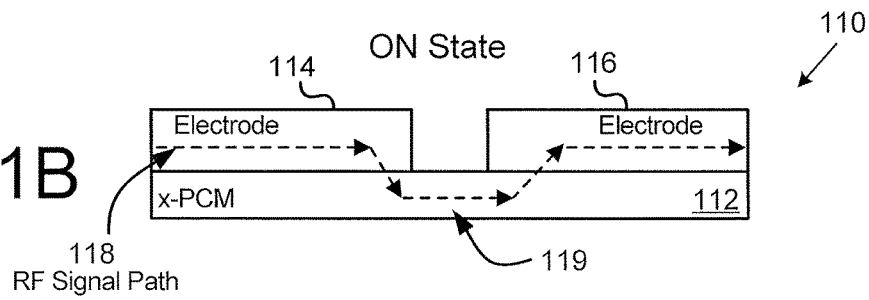
FIG. 1B illustrates a portion of an exemplary PCM radio frequency (RF) switch in an ON state according to one implementation of the present application.

Prior to a description of the design of the high reliability RF switch according to the present application, some relevant concepts in relation to RF switches based on phase-change material (PCM) are discussed by reference to FIGS. 1A through 2C. FIG. 1A illustrates an exemplary graph of PCM temperature versus time according to one implementation of the present application. As illustrated in FIG. 1A, PCM temperature-time graph 100 includes trace 102 which represents the temperature of an "active segment" of a PCM, such as active segment 119 of PCM 112 in FIG. 1B, plotted over time when a crystallizing heat pulse is applied to the PCM. It is noted that, according to the present application, "active segment" of the PCM is that portion of the PCM that undergoes a phase change in response to a crystallizing or an amorphizing heat pulse and generally lies between electrical contacts (or electrodes) on each end of the PCM, whereas the "passive segment" of the PCM is that portion of the PCM that is generally not subject to a crystallizing or an amorphizing heat pulse and does not undergo a phase change. As shown in FIG. 1A, from time t0 to time t1, trace 102 rises from initial temperature $T_0$ to approximately above crystallization temperature $T_C$. From time t1 to time t2, trace 102 remains approximately above crystallization temperature $T_C$. From time t2 to time t3, trace 102 falls from approximately above crystallization temperature $T_C$ to approximately initial temperature $T_0$.

A heat pulse that holds the PCM at or above crystallization temperature $T_C$ for a sufficient amount of time will transform the PCM into a crystalline state. Accordingly, such a pulse may be referred to as a crystallizing pulse in the present application. Crystallization temperature $T_C$ depends on the PCM material. In one implementation, crystallization temperature $T_C$ can be approximately two hundred degrees Celsius (200° C.). The amount of time needed to transform the PCM into a crystalline state depends on the material, dimensions, temperature, and thermal conductivity of both the PCM and its neighboring structures. In one implementation, the time required can be approximately one microsecond (1 μs) or greater or less. In the present exemplary implementation, the duration from time t1 to time t2 in PCM temperature-time graph 100 can be approximately one microsecond (1 μs), and thus, trace 102 represents a crystallizing pulse (trace 102 is also referred to as crystallizing pulse 102 in the present application).

FIG. 1B illustrates a portion of an exemplary radio frequency (RF) switch according to one implementation of the present application. As illustrated in FIG. 1B, PCM RF switch 110 includes PCM 112, input electrode 114, output electrode 116, and RF signal path (or simply referred to as "RF signal") 118. FIG. 1B illustrates PCM RF switch 110 after a crystallizing pulse is applied to PCM 112. PCM 112 can comprise germanium telluride ($Ge_XTe_Y$), germanium antimony telluride ($Ge_XSb_YTe_Z$), germanium selenide ($Ge_XSe_Y$), or any other chalcogenide. In various implementations, PCM 112 can be germanium telluride having from 40% to 60% germanium by composition (i.e., $Ge_XTe_Y$, where $0.4 \leq X \leq 0.6$ and $Y=1-X$). As shown in FIG. 1B, PCM 112 is uniform and is denoted with the label "x-PCM," to indicate that PCM 112 is in the crystalline state. PCM 112 in the crystalline state has low resistivity and is able to easily conduct electrical current. Accordingly, RF signal 118 propagates along a path from input electrode 114, through PCM 112, to output electrode 116. It is noted that input electrode 114 and output electrode 116 can be substantially symmetrical and that their roles in PCM RF switch 110 can be reversed. PCM RF switch 110 in FIG. 1B is in an ON state.

Figure 1C:
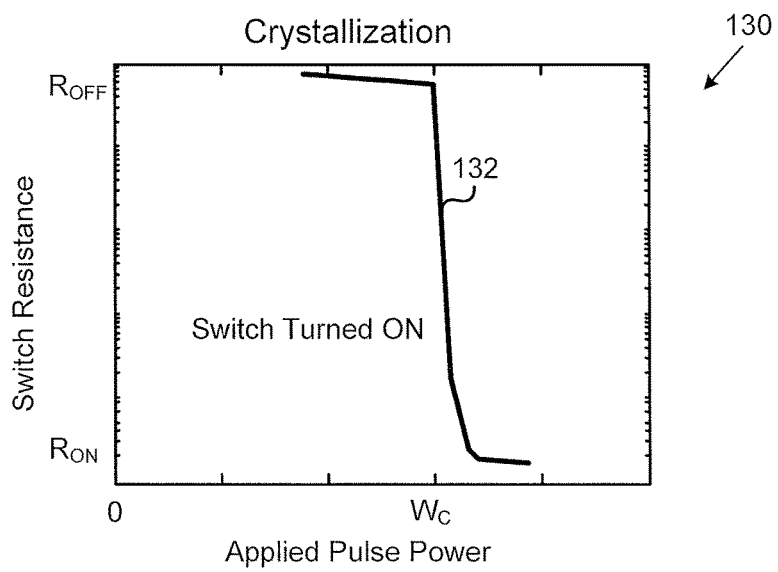
FIG. 1C illustrates an exemplary graph of switch resistance versus applied pulse power according to one implementation of the present application.

FIG. 1C illustrates an exemplary graph of switch resistance versus applied pulse power according to one implementation of the present application. As illustrated in FIG. 1C, switch resistance-applied pulse power graph 130 includes trace 132 that represents the resistance of PCM RF switch 110 in FIG. 1B, seen across input electrode 114 and output electrode 116, in response to a crystallizing pulse applied to PCM 112. As shown in FIG. 1C, when the pulse power increases past crystallization power $W_C$ (i.e., past the power needed to heat PCM 112 to crystallization temperature $T_C$), switch resistance decreases from $R_{OFF}$ to $R_{ON}$ as shown by trace 132. In one implementation, crystallization power $W_C$ can be approximately three tenths of a Watt (0.3 W). In various implementations, $R_{OFF}$ can range from approximately ten kilo-Ohms to approximately one mega-Ohm (10 kΩ-1MΩ). In one implementation, $R_{ON}$ can be approximately one Ohm (1Ω). Thus, trace 132 corresponds to PCM RF switch 110 turning ON in response to a crystallizing pulse.

Figure 2A:
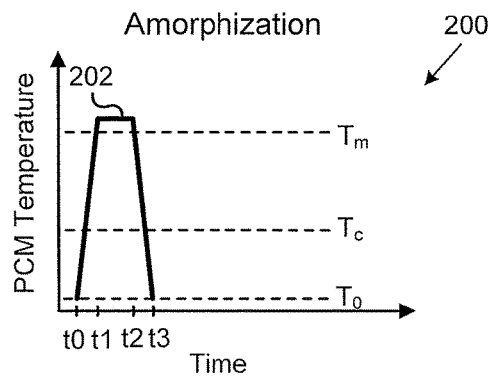
FIG. 2A illustrates an exemplary graph of PCM temperature versus time according to one implementation of the present application.
Figure 2B:
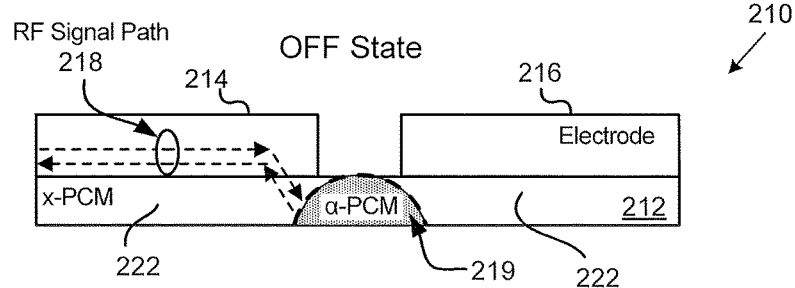
FIG. 2B illustrates a portion of an exemplary PCM RF switch in an OFF state according to one implementation of the present application.

FIG. 2A illustrates an exemplary graph of PCM temperature versus time according to one implementation of the present application. As illustrated in FIG. 2A, PCM temperature-time graph 200 includes trace 202 which represents the temperature of an "active segment" of a PCM, such as active segment 219 of PCM 212 in FIG. 2B, plotted over time when an amorphizing heat pulse is applied to the PCM. It is noted that, according to the present application, "active segment" of the PCM is that portion of the PCM that undergoes a phase change in response to a crystallizing or an amorphizing heat pulse and generally lies between electrical contacts (or electrodes) on each end of the PCM, whereas the "passive segment" of the PCM is that portion of the PCM that is generally not subject to a crystallizing or an amorphizing heat pulse and does not undergo a phase change. As shown in FIG. 2A, from time t0 to time t1, trace 202 rises from initial temperature $T_0$ to approximately above melting temperature $T_M$. From time t1 to time t2, trace 202 remains approximately above melting temperature $T_M$. From time t2 to time t3, trace 202 falls from approximately above melting temperature $T_M$ to approximately initial temperature $T_0$. Notably, from time t0 to time t3, trace 202 in FIG. 2A rises and falls more quickly than trace 102 in FIG. 1A.

A heat pulse that melts and rapidly quenches the PCM from a temperature at or above melting temperature $T_M$ will transform the PCM into an amorphous state. Accordingly, such a pulse may be referred to as an amorphizing pulse in the present application. Melting temperature $T_M$ depends on the PCM material. In one implementation, melting temperature $T_M$ can be approximately seven hundred degrees Celsius (700° C.). How rapidly the PCM must be quenched in order to transform the PCM into an amorphous state depends on the material, dimensions, temperature, and thermal conductivity of both the PCM and its surrounding structures. In one implementation, the quench time window can be approximately one hundred nanoseconds (100 ns) or greater or less. In this implementation, the duration from time t2 to time t3 in PCM temperature graph 200 can be approximately one hundred nanoseconds (100 ns), and thus, trace 202 represents an amorphizing pulse (trace 202 is also referred to as amorphizing pulse 202 in the present application).

FIG. 2B illustrates a portion of an exemplary PCM RF switch according to one implementation of the present application. As illustrated in FIG. 2B, PCM RF switch 210 includes PCM 212, input electrode 214, output electrode 216, and RF signal path (or simply referred to as "RF signal") 218. FIG. 2B illustrates PCM RF switch 210 after an amorphizing pulse is applied to PCM 212. PCM RF switch 210 in FIG. 2B generally corresponds to PCM RF switch 110 in FIG. 1B, and may have any of the implementations and advantages thereof. As shown in FIG. 2B, PCM 212 is not uniform. PCM 212 includes active segment 219, and passive segments 222. As used herein, "active segment" refers to a segment of PCM that transforms between crystalline and amorphous states, for example, in response to heat pulses, whereas "passive segment" refers to a segment of PCM that does not make such transformation and maintains a crystalline state (i.e., maintains a conductive state). Active segment 219 is denoted with the label "α-PCM," to indicate that active segment 219 is in the amorphous state. Passive segments 222 are denoted with the label "x-PCM," to indicate that passive segments 222 are in the crystalline state. PCM 212 in the amorphous state has high resistivity and is not able to conduct electrical current well. Accordingly, RF signal 218 does not propagate along a path from input electrode 214, through PCM 212, to output electrode 216. It is noted that input electrode 214 and output electrode 216 can be substantially symmetrical and that their roles in PCM RF switch 210 can be reversed. PCM RF switch 210 in FIG. 2B is in an OFF state.

Figure 2C:
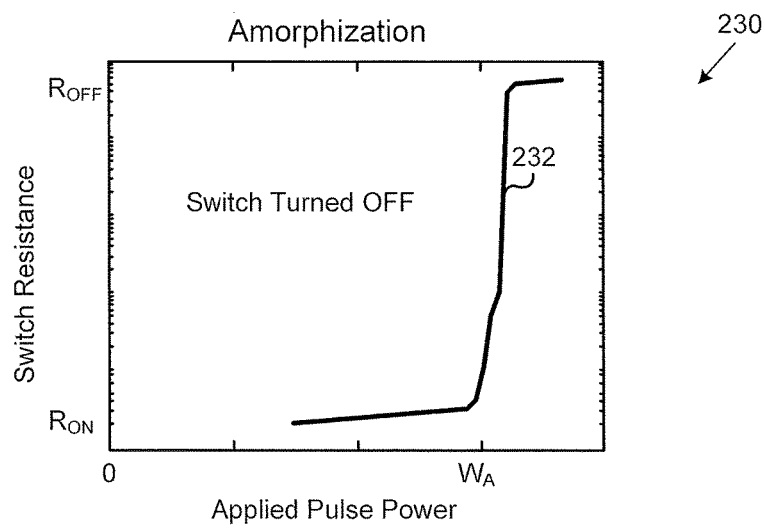
FIG. 2C illustrates an exemplary graph of switch resistance versus applied pulse power according to one implementation of the present application.

FIG. 2C illustrates an exemplary graph of switch resistance versus applied pulse power according to one implementation of the present application. As illustrated in FIG. 2C, switch resistance graph 230 includes trace 232 that represents the resistance of PCM RF switch 210 in FIG. 2B, seen across input electrode 214 and output electrode 216, in response to an amorphizing pulse is applied to PCM 212. As shown in FIG. 2C, when the pulse power increases past amorphization power $W_A$ (i.e., past the power needed to heat PCM 212 to melting temperature $T_M$), switch resistance increases from $R_{ON}$ to $R_{OFF}$ as shown by trace 232. In one implementation, amorphization power $W_A$ can be approximately one and a half Watts (1.5 W). In various implementations, $R_{OFF}$ can range from approximately ten kilo-Ohms to approximately one mega-Ohm (10 kΩ-1MΩ). In one implementation, $R_{ON}$ can be approximately one Ohm (1Ω). Thus, trace 232 represents PCM RF switch 210 turning OFF in response to an amorphizing pulse.

Figure 3A:
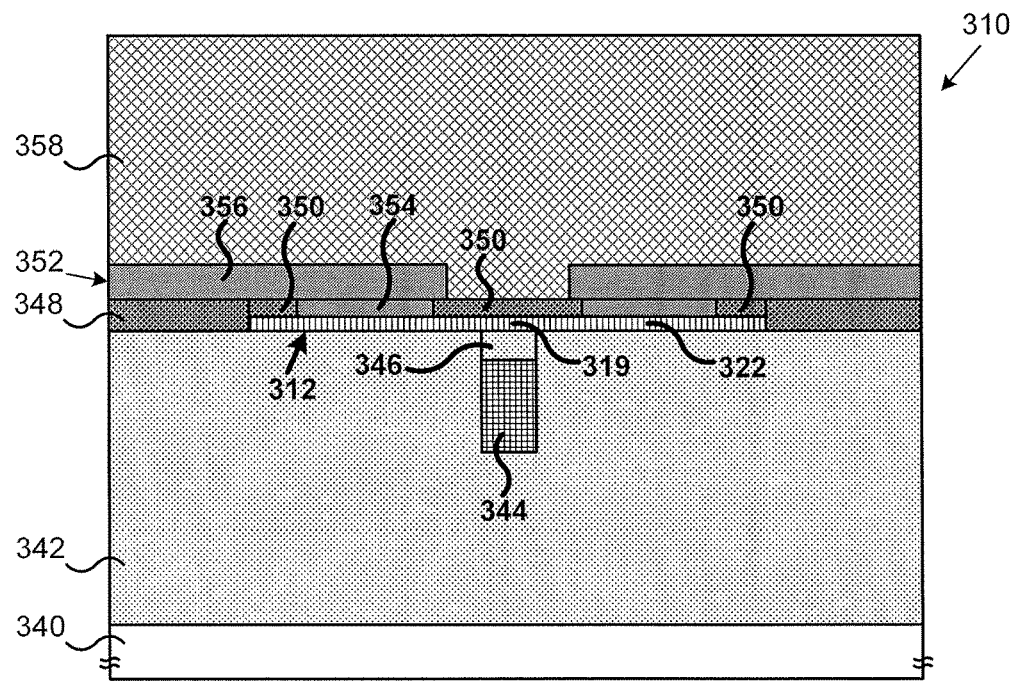
FIG. 3A illustrates a portion of an exemplary PCM RF switch according to one implementation of the present application.

FIG. 3A illustrates a portion of an exemplary PCM RF switch according to one implementation of the present application. As illustrated in FIG. 3A, PCM RF switch 310 includes substrate 340, heat spreader 342, heating element 344, nugget 346, PCM 312 having active segment 319 and passive segments 322, silicon nitride (SiN) segments 348 and 350, input/output contacts 352 having lower portions 354 and upper portions 356, and dielectric 358.

In one implementation, substrate 340 is an insulator, such as silicon oxide ($SiO_2$). In various implementations, substrate 340 is a silicon (Si), silicon-on-insulator (SOI), sapphire, complementary metal-oxide-semiconductor (CMOS), bipolar CMOS (BiCMOS), or group III-V substrate. In various implementations, PCM RF switch 310 can be provided without substrate 340 or PCM RF switch 310 can be integrated with substrate 340. Substrate 340 can have additional layers not shown in FIG. 3A.

As illustrated in FIG. 3A, heat spreader 342 is situated over substrate 340, under SiN segments 348, and under passive segments 322 of PCM 312. Heat spreader 342 is also situated on the sides of and under heating element 344. Heat spreader 342 generally dissipates excess heat generated by PCM RF switch 310. In particular, heat spreader 342 dissipates excess heat generated by heating element 344 after a heat pulse, such as a crystallizing pulse or an amorphizing pulse, has transformed the state of the PCM switch to an ON state or an OFF state. Heat spreader 342 can comprise any material with high thermal conductivity. In one implementation, heat spreader 342 can comprise a material with both high thermal conductivity and high electrical resistivity. In various implementation, heat spreader 342 can comprise aluminum nitride (AlN), aluminum oxide ($Al_xO_Y$), beryllium oxide ($Be_xO_Y$), silicon carbide (SiC), diamond, or diamond-like carbon. In one implementation, heat spreader 342 itself performs as a substrate and a separate substrate is not used. For example, heat spreader 342 can comprise Si and be provided without substrate 340. In one implementation, heat spreader 342 can be integrated with substrate 340.

Heating element 344 in PCM RF switch 310 generates a crystallizing pulse or an amorphizing pulse for transforming active region 319 of PCM 312, as described above. Heating element 344 can comprise any material capable of Joule heating. Heating element 344 can be connected to electrodes of a current source (not shown in FIG. 3A) in order to generate a crystallizing pulse or an amorphizing pulse. Preferably, heating element 344 comprises a material that exhibits minimal electromigration or substantially no electromigration. In various implementations, heating element 344 can comprise a metal such as tungsten (W), molybdenum (Mo), titanium (Ti), titanium tungsten (TiW), titanium nitride (TiN), tantalum (Ta), nickel chromium (NiCr), or nickel chromium silicon (NiCrSi). For example, in one implementation, heating element 344 comprises tungsten lined with titanium and titanium nitride. In one implementation, heating element 344 can have a thickness of approximately five hundred angstroms to approximately five thousand angstroms (500 Å-5000 Å). In one implementation, heating element 344 can have a width of approximately one quarter micron to approximately two and one half microns (0.25 μm-2.5 μm).

As shown in FIG. 3A, PCM RF switch 310 includes nugget 346 situated on top of heating element 344 and under active segment 319 of PCM 312. As used herein "nugget" refers to a segment of thermally conductive and electrically insulating material on top of heating element 344. As described below, among other utilities, nugget 346 ensures efficient heat transfer between heating element 344 and active segment 319 of PCM 312, while preventing electrical signals from leaking out from the path between input/output contacts 352 to heating element 344 or to other neighboring structures. Nugget 346 can comprise any material with high thermal conductivity and high electrical resistivity. In various implementations, nugget 346 can comprise AlN, $Al_xO_Y$, $Be_xO_Y$, SiC, SiN, diamond, or diamond-like carbon. In the implementation illustrated in FIG. 3A, nugget 346 is shown to comprise the same material as heat spreader 342. For example, nugget 346 and heat spreader 342 can both comprise AlN and can surround heating element 344. However, in other implementations, nugget 346 and heat spreader 342 can comprise different materials. In one implementation, nugget 346 can have a higher thermal conductivity than heat spreader 342 to ensure that a heat pulse generated by heating element 344 dissipates toward active segment 319 of PCM 312 more rapidly than it dissipates toward heat spreader 342. In one implementation, nugget 346 can have a thickness of approximately five hundred angstroms to approximately five thousand angstroms (500 Å-5000 Å). In one implementation, nugget 346 can have a width of approximately one quarter micron to approximately two and one half microns (0.25 µm-2.5 µm).

As shown in FIG. 3A, active segment 319 of PCM 312 is situated approximately over nugget 346, and passive segments 322 of PCM 312 are situated approximately under input/output contacts 352 and over heat spreader 342. It is noted that, according to the present application, "active segment" of the PCM is that portion of the PCM that undergoes a phase change in response to a crystallizing or an amorphizing heat pulse and generally lies between electrical contacts (or electrodes) on each end of the PCM, whereas the "passive segment" of the PCM is that portion of the PCM that is generally not subject to a crystallizing or an amorphizing heat pulse and does not undergo a phase change. As described above, with proper heat pulses and heat dissipation, active segment 319 of PCM 312 can transform between crystalline and amorphous states, allowing PCM RF switch 310 to switch between ON and OFF states respectively. PCM 312 can comprise germanium telluride ($Ge_XTe_Y$), germanium antimony telluride ($Ge_XSb_YTe_Z$), germanium selenide ($Ge_XSe_Y$), or any other chalcogenide. In various implementations, PCM 312 can be germanium telluride having from forty percent to sixty percent germanium by composition (i.e., $Ge_XTe_Y$, where $0.4 \leq X \leq 0.6$ and $Y=1-X$). The material for PCM 312 can be chosen based upon ON state resistivity, OFF state electric field breakdown voltage, crystallization temperature, melting temperature, or other considerations. PCM 312 can be deposited, for example, by physical vapor deposition (PVD), chemical vapor deposition (CVD), or atomic layer deposition (ALD). In one implementation, PCM 312 can have a thickness of approximately five hundred angstroms to approximately two thousand angstroms (500 Å-2000 Å). In one implementation, PCM 312 can have a width of approximately two microns to approximately ten microns (2 µm-10 µm). In other implementations, PCM 312 can have any other thicknesses and widths. The thickness and width of PCM 312 can be chosen based upon sheet resistance, crystallization power, amorphization power, or other considerations.

In the present exemplary implementation, PCM RF switch 310 further includes SiN segments 348 and 350. SiN segments 348 are situated on the sides of PCM 312, over heat spreader 342. SiN segments 348 passivate PCM 312 and can also prevent input/output contacts 352 from coupling with structures other than PCM 312. SiN segments 350 are situated over PCM 312 on the sides of lower portions 354 of input/output contacts 352. SiN segments 350 are preferably thin segments that do not require aggressive etching. As such, PCM 312 is kept substantially undamaged during formation of holes for lower portions 354 of input/output contacts 352. As described below, keeping PCM 312 undamaged in this manner enables more uniform contact to PCM 312, and lowers ON state resistance ($R_{ON}$) for PCM RF switch 310. Accordingly, SiN segments 350 may be referred to as a contact uniformity support layer in the present application. In one implementation, SiN segments 350 can have a thickness of approximately fifty angstroms to approximately two thousand angstroms (50 Å-2000 Å). In one implementation segments 348 and/or 350 can comprise an oxide, such as $SiO_2$, rather than SiN.

Input/output contacts 352 have lower portions 354 connected to passive segments 322 of PCM 312, and have upper portions 356 connected to lower portions 354. Upper portions 356 of input/output contacts 352 are wider than lower portions 354 of input/output contacts 352, and are situated over SiN segments 348 and SiN segments 350 (SiN segments 350 also referred to as contact uniformity support layer 350 in the present application). Lower portions 354 of input/output contacts 352 are situated on top of PCM 312. In another implementation, lower portions 354 of input/output contacts 352 can extend partially into PCM 312. Input/output contacts 352 can comprise any material able to conduct an RF signal. In various implementations, input/output contacts 352 can comprise tungsten (W), copper (Cu), aluminum (Al), or other metal. In various implementations, input/output contacts 352 may have different shapes, be situated differently with respect to neighboring structures, or be situated over other neighboring structures not shown in FIG. 3A, while still providing connection to PCM 312.

In FIG. 3A, dielectric 358 is situated over upper portions 356 of input/output contacts 352 and over one of SiN segments 350. In one implementation, dielectric 358 is $SiO_2$. In other implementations, dielectric 358 is SiN, or another dielectric. In general, any number of vias, interconnects, insulations, and protective layers as desired for PCM RF switch 310 can be used in addition to dielectric 358.

Figure 3B:
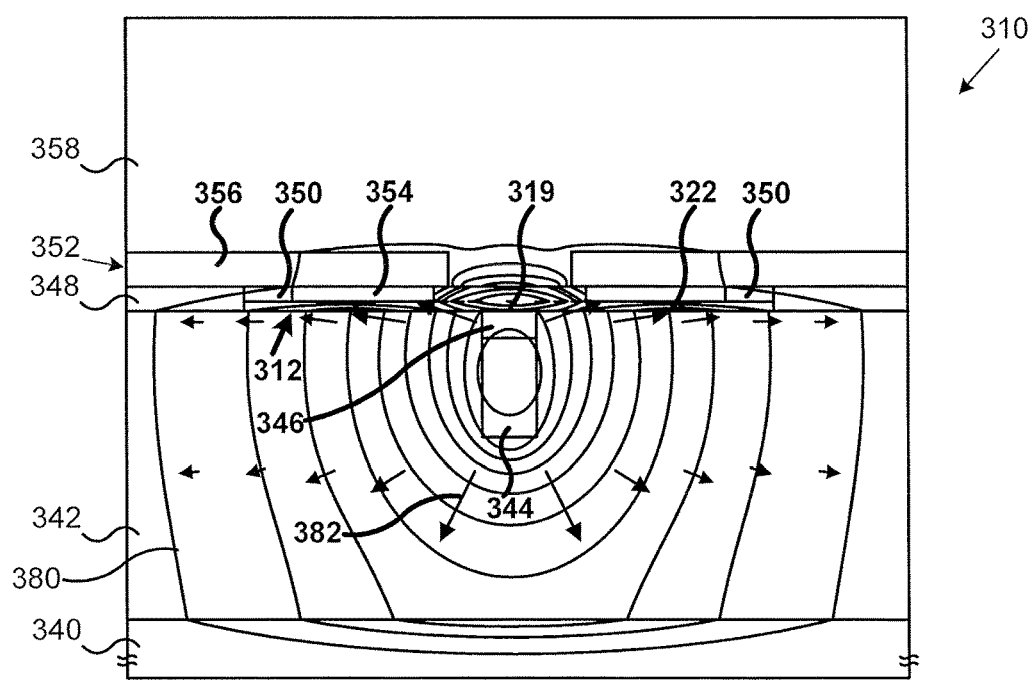
FIG. 3B is a diagram illustrating heat contours corresponding to the structure shown in PCM RF switch of FIG. 3A.

FIG. 3B is a diagram illustrating thermal or heat contours corresponding to the structure shown in PCM RF switch 310 of FIG. 3A. As illustrated in FIG. 3B, PCM RF switch 310 shows substrate 340, heat spreader 342, heating element 344, nugget 346, PCM 312 having active segment 319 and passive segments 322, SiN segments 348 and 350, input/output contacts 352 having lower portions 354 and upper portions 356, and dielectric 358, all corresponding to like structures and elements shown in FIG. 3A. FIG. 3B illustrates heat contours 380 and heat flux arrows 382, in response to a heat pulse generated by heating element 344. Each heat contour 380 is an isotherm and represents an area of PCM RF switch 310 having substantially equal temperature during the heat pulse. The size and direction of heat flux arrows 382 generally correspond to the magnitude and direction of heat flux along heat contours 380.

As shown by heat contours 380 and heat flux arrows 382 in FIG. 3B, PCM RF switch 310 efficiently transfers heat from heating element 344 to active segment 319 of PCM 312 using nugget 346. Thus, active segment 319 of PCM 312 can reach temperatures needed for phase transformation. Further, PCM RF switch 310 efficiently dissipates heat across a relatively large area using heat spreader 342. Thus, PCM 312 can be rapidly quenched.

Figure 3C:
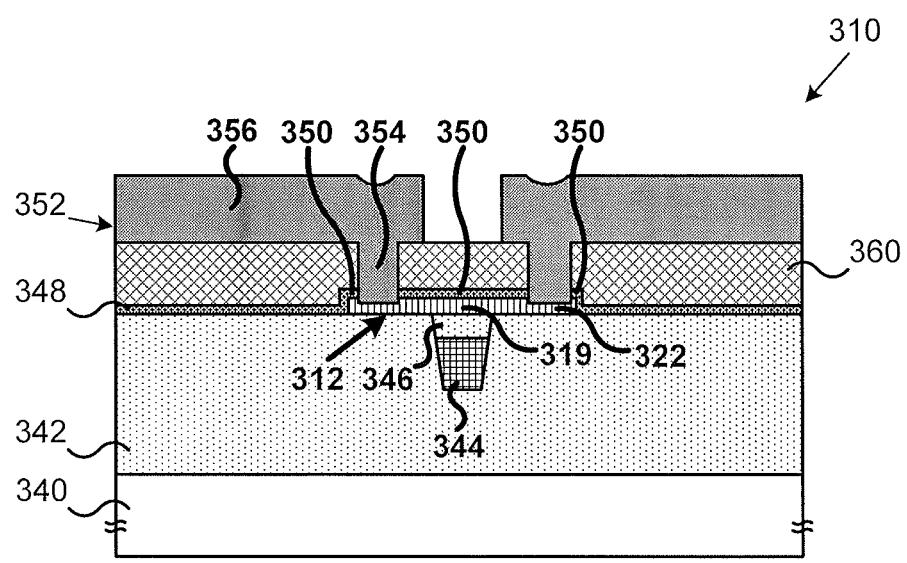
FIG. 3C illustrates a portion of an exemplary PCM RF switch according to one implementation of the present application.

FIG. 3C illustrates a portion of an exemplary PCM RF switch according to one implementation of the present application. As illustrated in FIG. 3C, PCM RF switch 310 includes substrate 340, heat spreader 342, heating element 344, nugget 346, PCM 312 having active segment 319 and passive segments 322, SiN segments 348 and 350, input/output contacts 352 having lower portions 354 and upper portions 356, and dielectric 360. While PCM RF switch 310 in FIG. 3A is used to illustrate the various inventive concepts in the present application and to closely correspond to the heat contours shown in the diagram of FIG. 3B, PCM RF switch 310 in FIG. 3C corresponds more closely to a practical implementation and manufacturing according to the present application. In FIG. 3C, lower portions 354 of input/output contacts 352 are slightly thicker compared to FIG. 3A, because PCM RF switch 310 in FIG. 3C includes dielectric 360 situated over SiN segments 348 and under upper portions 356 of input/output contacts 352. In various implementations, input/output contacts 352 may have different shapes, be situated differently with respect to neighboring structures, or be situated over other neighboring structures not shown in FIG. 3C, while still providing connection to PCM 312. Other than the differences described above, PCM RF switch 310 in FIG. 3C generally corresponds to PCM RF switch 310 in FIG. 3A, and may have any of the implementations and advantages described above with respect to FIG. 3A.

Figure 4A:
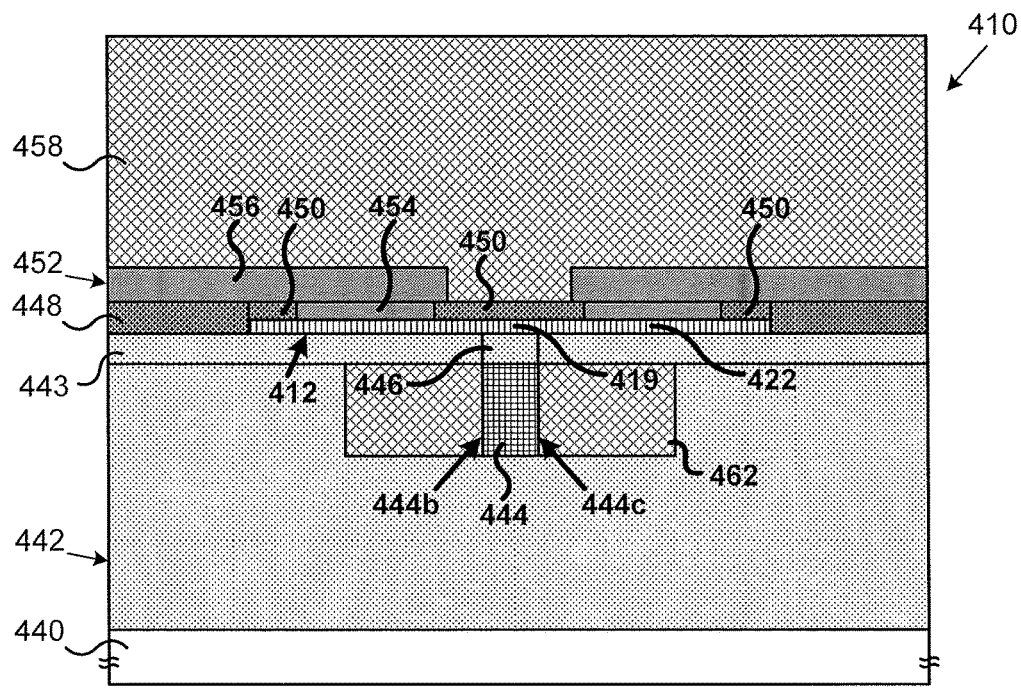
FIG. 4A illustrates a portion of an exemplary PCM RF switch according to one implementation of the present application.

FIG. 4A illustrates a portion of an exemplary PCM RF switch according to one implementation of the present application. As illustrated in FIG. 4A, PCM RF switch 410 includes substrate 440, heat spreader 442 having portions 443, heating element 444, nugget 446, PCM 412 having active segment 419 and passive segments 422, SiN segments 448 and 450, input/output contacts 452 having lower portions 454 and upper portions 456, dielectric 458, and thermally resistive material 462.

PCM RF switch 410 in FIG. 4A is similar to PCM RF switch 310 in FIG. 3A, except that PCM RF switch 410 in FIG. 4A includes thermally resistive material 462 adjacent to sides 444b and 444c of heating element 444. As shown in FIG. 4A, thermally resistive material 462 has substantially the same thickness as heating element 444, and thermally resistive material 462 is substantially coplanar with heating element 444. Portions 443 of heat spreader 442 are situated on top of thermally resistive material 462. Passive segments 422 of PCM 412 are approximately overlying thermally resistive material 462. Thermally resistive material 462 can comprise any material with thermal resistivity lower than that of nugget 446 or heat spreader 442. In one implementation, thermally resistive material 462 can comprise $SiO_2$. In other implementations, thermally resistive material 462 can comprise SiN, or another dielectric. In one implementation, thermally resistive material 462 can be indirectly adjacent to sides 444b and 444c of heating element 444. In another implementation, thermally resistive material 462 can be adjacent to one of sides 444b or 444c, rather than adjacent to both. In other implementations, thermally resistive material 462 can have different thickness than heating element 444. For example, in one implementation, the bottom of heating element 444 extends to a depth below that of thermally resistive material 462.

Figure 4B:
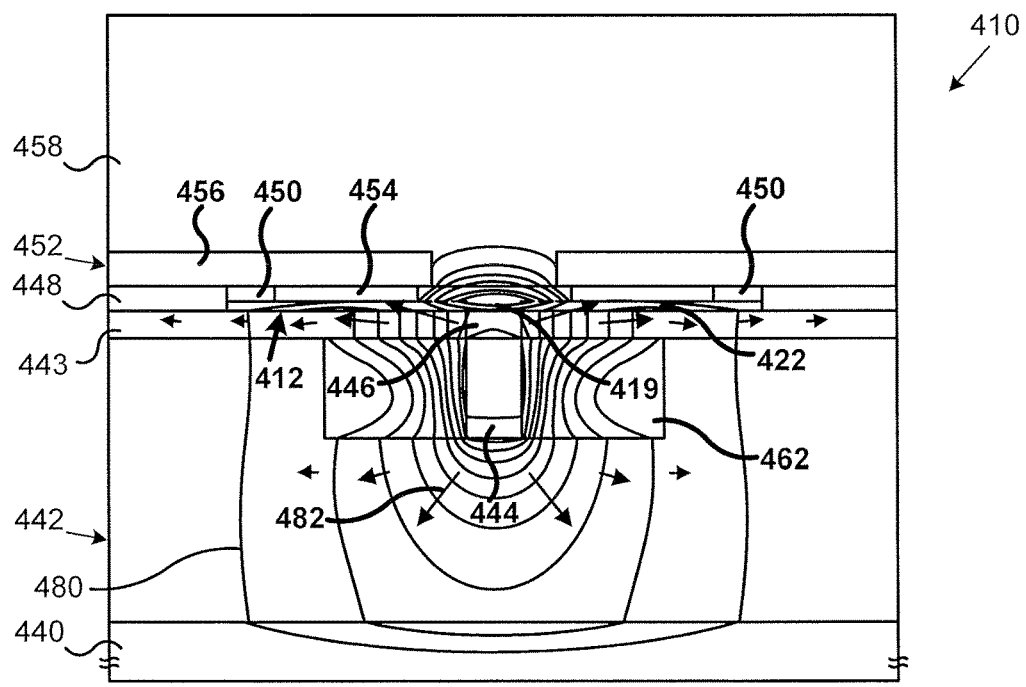
FIG. 4B is a diagram illustrating heat contours corresponding to the structure shown in PCM RF switch of FIG. 4A.

FIG. 4B is a diagram illustrating thermal or heat contours corresponding to the structure shown in PCM RF switch 410 of FIG. 4A. As illustrated in FIG. 4B, PCM RF switch 410 includes substrate 440, heat spreader 442 having portions 443, heating element 444, nugget 446, PCM 412 having active segment 419 and passive segments 422, SiN segments 448 and 450, input/output contacts 452 having lower portions 454 and upper portions 456, dielectric 458, and thermally resistive material 462, all corresponding to like structures and elements shown in FIG. 4A. FIG. 4B illustrates heat contours 480 and heat flux arrows 482, in response to a heat pulse generated by heating element 444. Each heat contour 480 is an isotherm and represents an area of PCM RF switch 410 having substantially equal temperature during the heat pulse. The size and direction of heat flux arrows 482 generally correspond to the magnitude and direction of heat flux along heat contours 480.

As shown by heat contours 480 and heat flux arrows 482 in FIG. 4B, PCM RF switch 410 dissipates more heat vertically as compared to PCM RF switch 310 in FIG. 3B. Because PCM RF switch 410 includes thermally resistive material 462 on the sides of heating element 444, less heat transfers horizontally (i.e. from the sides) and more heat dissipates vertically, from heating element 344 both toward active segment 419 of PCM 412 and toward heat spreader 442. Thus, active segment 419 of PCM 412 can reach higher temperatures for the same applied pulse power. Further, PCM RF switch 410 reduces heating of passive segments 422 and input/output contacts 452 overlying thermally resistive material 462 which would otherwise be caused by heating element 444. Thus, it is less necessary to increase the width of PCM 412 and the spacing of input/output contacts 452 (which could detrimentally increase $R_{ON}$) in order to reduce thermal cycling consequences to these structures.

Figure 4C:
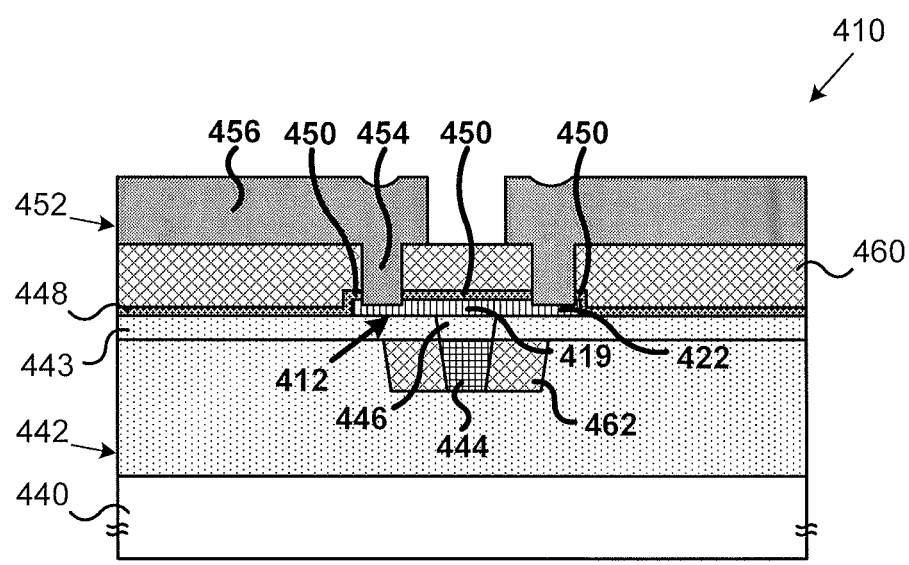
FIG. 4C illustrates a portion of an exemplary PCM RF switch according to one implementation of the present application.

FIG. 4C illustrates a portion of an exemplary PCM RF switch according to one implementation of the present application. As illustrated in FIG. 4B, PCM RF switch 410 includes substrate 440, heat spreader 442 having portions 443, heating element 444, nugget 446, PCM 412 having active segment 419 and passive segments 422, SiN segments 448 and 450, input/output contacts 452 having lower portions 454 and upper portions 456, dielectric 460, and thermally resistive material 462. PCM RF switch 410 in FIG. 4C generally corresponds to PCM RF switch 410 in FIGS. 4A and 4B, and is more closely suited for manufacturing and practical implementations.

Figure 5A:
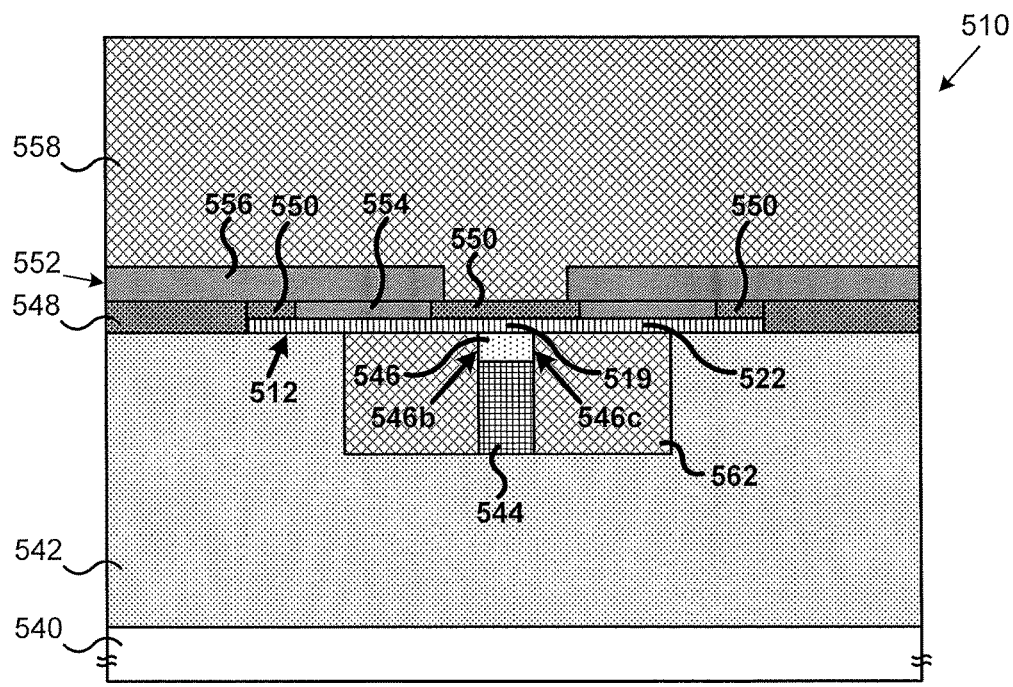
FIG. 5A illustrates a portion of an exemplary PCM RF switch according to one implementation of the present application.

FIG. 5A illustrates a portion of an exemplary PCM RF switch according to one implementation of the present application. As illustrated in FIG. 5A, PCM RF switch 510 includes substrate 540, heat spreader 542, heating element 544, nugget 546, PCM 512 having active segment 519 and passive segments 522, SiN segments 548 and 550, input/output contacts 552 having lower portions 554 and upper portions 556, dielectric 558, and thermally resistive material 562.

PCM RF switch 510 in FIG. 5A is similar to PCM RF switch 410 in FIG. 4A, except that PCM RF switch 510 in FIG. 5A includes thermally resistive material 562 adjacent to sides 546b and 546c of nugget 546. As shown in FIG. 5A, thermally resistive material 562 has substantially the same thickness as heating element 544 and nugget 546 combined, and thermally resistive material 562 is substantially coplanar with the top of nugget 546 and the bottom of heating element 544. Passive segments 522 of PCM 512 are situated over thermally resistive material 562 as well as over heat spreader 542. In one implementation, thermally resistive material 562 can be indirectly adjacent to sides 546b and 546c of nugget 546. In another implementation, thermally resistive material 562 can be adjacent to one of sides 546b or 546c, rather than adjacent to both. In other implementations, thermally resistive material 562 can have different thickness than heating element 544 and nugget 546 combined. For example, in one implementation, nugget 546 and thermally resistive material 562 have substantially the same depth.

Figure 5B:
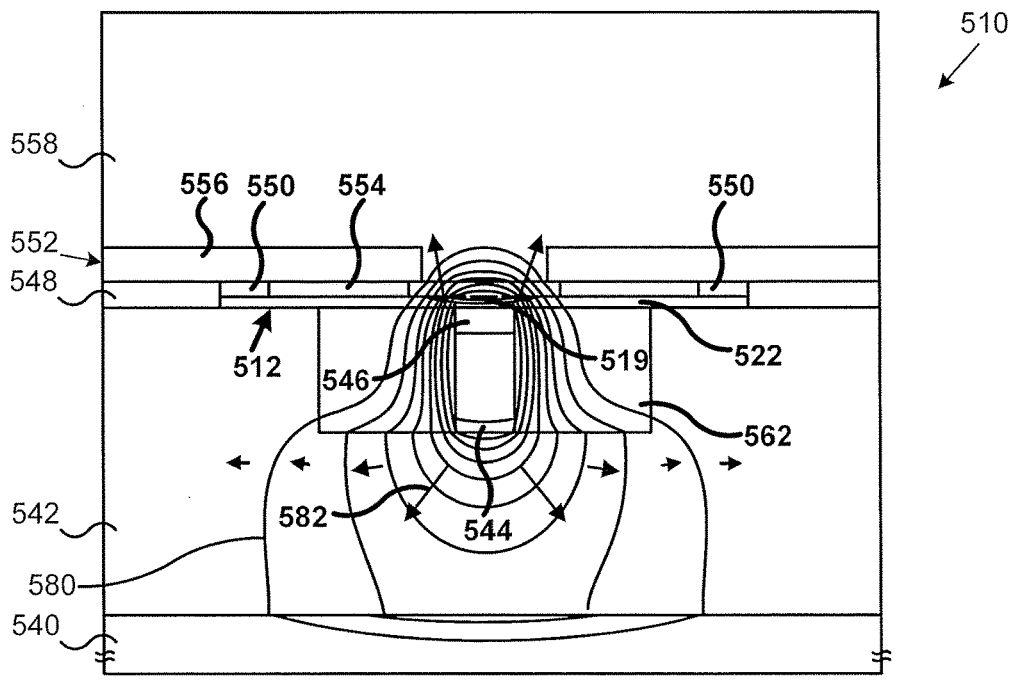
FIG. 5B is a diagram illustrating heat contours corresponding to the structure shown in PCM RF switch of FIG. 5A.

FIG. 5B is a diagram illustrating thermal or heat contours corresponding to the structure shown in PCM RF switch 510 of FIG. 5A. As illustrated in FIG. 5B, PCM RF switch 510 includes substrate 540, heat spreader 542, heating element 544, nugget 546, PCM 512 having active segment 519 and passive segments 522, SiN segments 548 and 550, input/output contacts 552 having lower portions 554 and upper portions 556, dielectric 558, and thermally resistive material 562, all corresponding to like structures and elements shown in FIG. 5A. FIG. 5B illustrates heat contours 580 and heat flux arrows 582, in response to a heat pulse generated by heating element 544. Each heat contour 580 is an isotherm and represents an area of PCM RF switch 510 having substantially equal temperature during the heat pulse. The size and direction of heat flux arrows 582 generally correspond to the magnitude and direction of heat flux along heat contours 580.

Figure 5C:
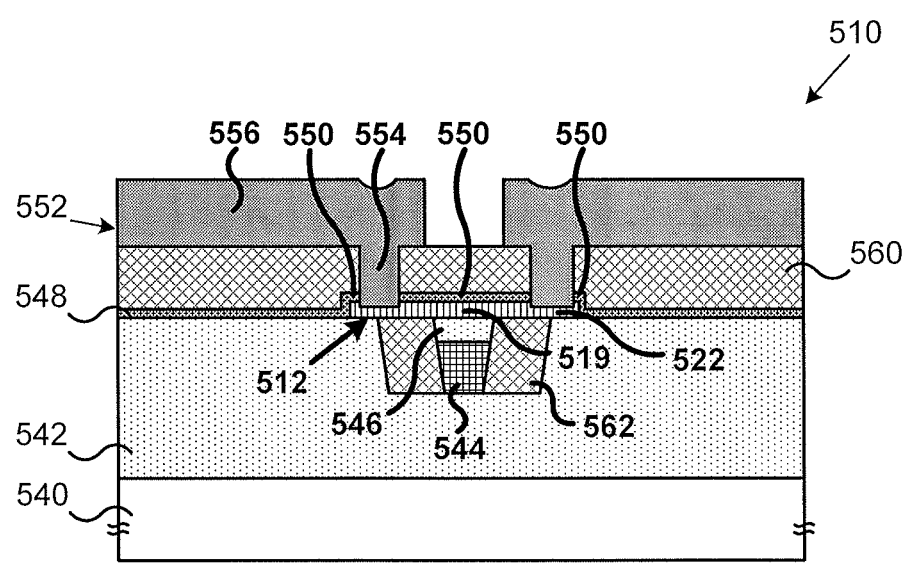
FIG. 5C illustrates a portion of an exemplary PCM RF switch according to one implementation of the present application.

As shown by heat contours 580 and heat flux arrows 582 in FIG. 5B, PCM RF switch 510 dissipates significantly less heat towards passive segments 522 and input/output contacts 552 as compared to PCM RF switch 410 in FIG. 4B. In other words, heat contours 580 above heating element 544 are significantly more confined to active segment 519. Because PCM RF switch 510 includes thermally resistive material 562 adjacent to sides 546b and 546c of nugget 546, more heat dissipates vertically from heating element 544 toward active segment 519 of PCM 512. Thus, active segment 519 of PCM 512 can reach even higher temperatures for the same applied pulse power. Further, PCM RF switch 510 significantly reduces heating of passive segments 522 and input/output contacts 552 overlying thermally resistive material 562, and since unlike PCM RF switch 410 of FIG. 4A, the passive segments are not entirely situated directly over a thermally conductive material, such as portions 443 of heat spreader 442. Thus, it is less necessary to space these structures further from heating element 544 (which could detrimentally increase $R_{ON}$) in order to reduce consequences of thermal cycling. FIG. 5C illustrates a portion of an exemplary PCM RF switch according to one implementation of the present application. As illustrated in FIG. 5C, PCM RF switch 510 includes substrate 540, heat spreader 542, heating element 544, nugget 546, PCM 512 having active segment 519 and passive segments 522, SiN segments 548 and 550, input/output contacts 552 having lower portions 554 and upper portions 556, dielectric 560, and thermally resistive material 562. PCM RF switch 510 in FIG. 5C generally corresponds to PCM RF switch 510 in FIGS. 5A and 5B, and is more closely suited for manufacturing and practical implementations.

Figure 6A:
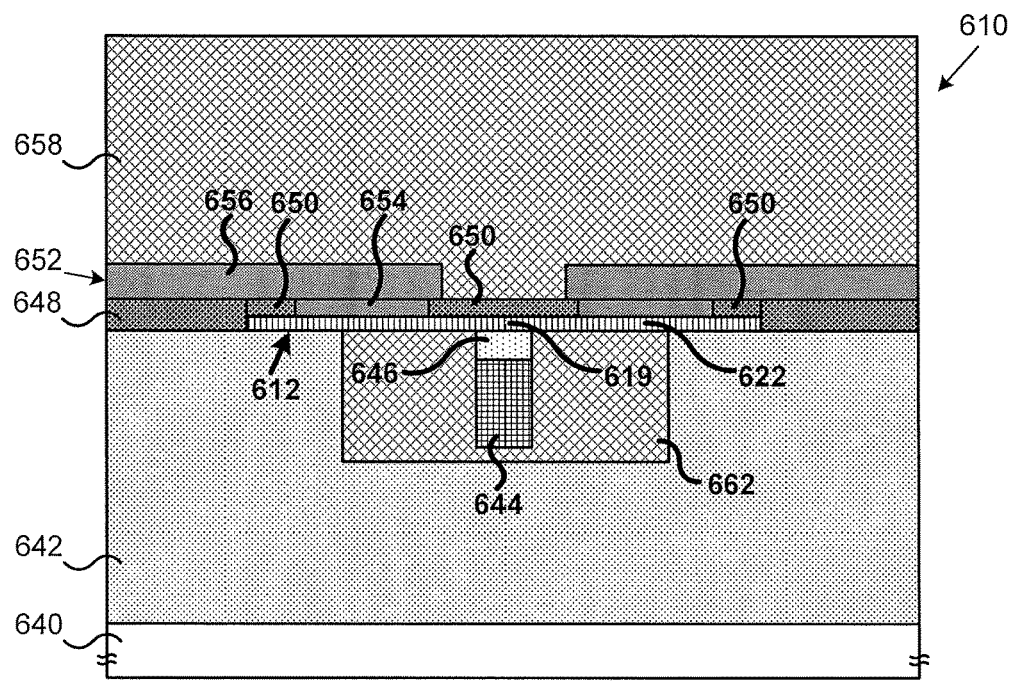
FIG. 6A illustrates a portion of an exemplary PCM RF switch according to one implementation of the present application.

FIG. 6A illustrates a portion of an exemplary PCM RF switch according to one implementation of the present application. As illustrated in FIG. 6A, PCM RF switch 610 includes substrate 640, heat spreader 642, heating element 644, nugget 646, PCM 612 having active segment 619 and passive segments 622, SiN segments 648 and 650, input/output contacts 652 having lower portions 654 and upper portions 656, dielectric 658, and thermally resistive material 662.

PCM RF switch 610 in FIG. 6A is similar to PCM RF switch 510 in FIG. 5A, except that PCM RF switch 610 in FIG. 6A includes thermally resistive material 662 under heating element 644. As shown in FIG. 6A, thermally resistive material 662 has thickness greater than heating element 644 and nugget 646 combined, and thermally resistive material 662 is substantially coplanar with the top of nugget 646. As such, thermally resistive material 662 extends to a depth greater than that of heating element 644 and thermally resistive material 662 is under heating element 644. As described below, thermally resistive material 662 under heating element 644 performs as a heat valve. In one implementation, the thickness of thermally resistive material 662 under heating element 644 is approximately two hundred angstroms (200 Å). In one implementation, rather than PCM RF switch 610 including thermally resistive material 662 under heating element 644, PCM RF switch 610 can include a heat valve distinct from thermally resistive material 662. For example, PCM RF switch 610 can include a liner around heating element 644 that performs as a heat valve. As another example, PCM RF switch 610 can include another thermally resistive material under heating element 644 having a width substantially matching a width of heating element 644.

Figure 6B:
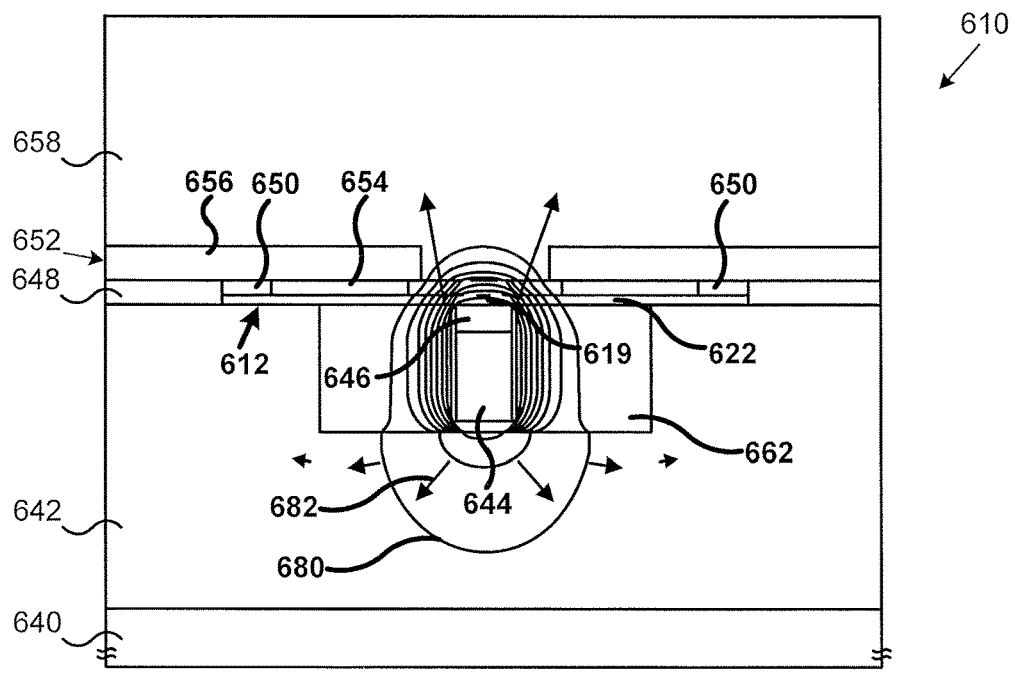
FIG. 6B is a diagram illustrating heat contours corresponding to the structure shown in PCM RF switch of FIG. 6A.

FIG. 6B is a diagram illustrating thermal or heat contours corresponding to the structure shown in PCM RF switch 610 of FIG. 6A. As illustrated in FIG. 6B, PCM RF switch 610 includes substrate 640, heat spreader 642, heating element 644, nugget 646, PCM 612 having active segment 619 and passive segments 622, SiN segments 648 and 650, input/output contacts 652 having lower portions 654 and upper portions 656, dielectric 658, and thermally resistive material 662, all corresponding to like structures and elements shown in FIG. 6A. FIG. 6B illustrates heat contours 680 and heat flux arrows 682, in response to a heat pulse generated by heating element 644. Each heat contour 680 is an isotherm and represents an area of PCM RF switch 610 having substantially equal temperature during the heat pulse. The size and direction of heat flux arrows 682 generally correspond to the magnitude and direction of heat flux along heat contours 680.

As shown by heat contours 680 and heat flux arrows 682 in FIG. 6B, thermally resistive material 662 under heating element 644 performs as a heat valve, and PCM RF switch 610 dissipates significantly less heat vertically towards heat spreader 642 as compared to PCM RF switch 510 in FIG. 5B. Heat contours 680 below heating element 644 are significantly more confined. Because PCM RF switch 610 includes thermally resistive material 662 under heating element 644, vertical heat dissipation from heating element 644 is heavily biased toward active segment 619 of PCM 612, rather than toward heat spreader 642. Thus, active segment 619 of PCM 612 can reach even higher temperatures for the same applied pulse power.

Figure 6C:
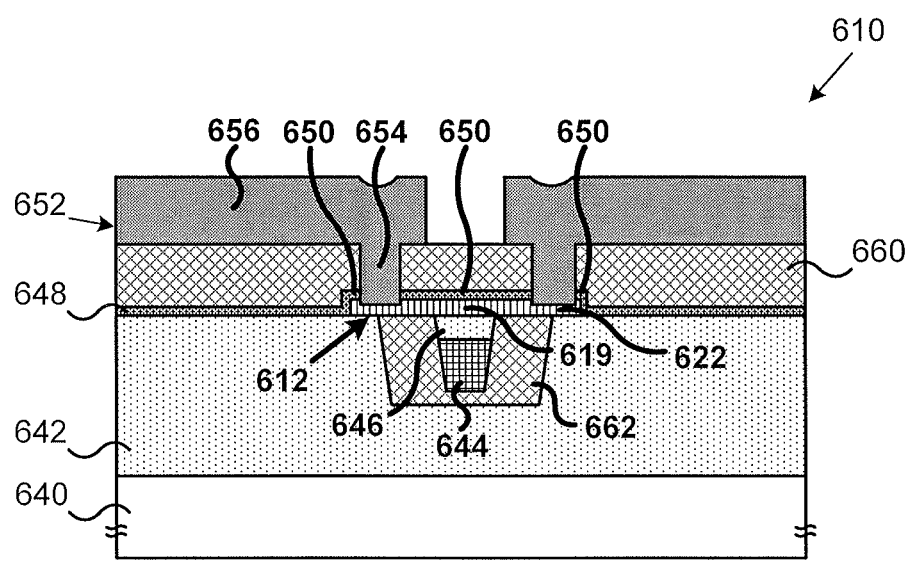
FIG. 6C illustrates a portion of an exemplary PCM RF switch according to one implementation of the present application.

FIG. 6C illustrates a portion of an exemplary PCM RF switch according to one implementation of the present application. As illustrated in FIG. 6C, PCM RF switch 610 includes substrate 640, heat spreader 642, heating element 644, nugget 646, PCM 612 having active segment 619 and passive segments 622, SiN segments 648 and 650, input/output contacts 652 having lower portions 654 and upper portions 656, dielectric 660, and thermally resistive material 662. PCM RF switch 610 in FIG. 6C generally corresponds to PCM RF switch 610 in FIGS. 6A and 6B, and is more closely suited for manufacturing and practical implementations.

Figure 7A:
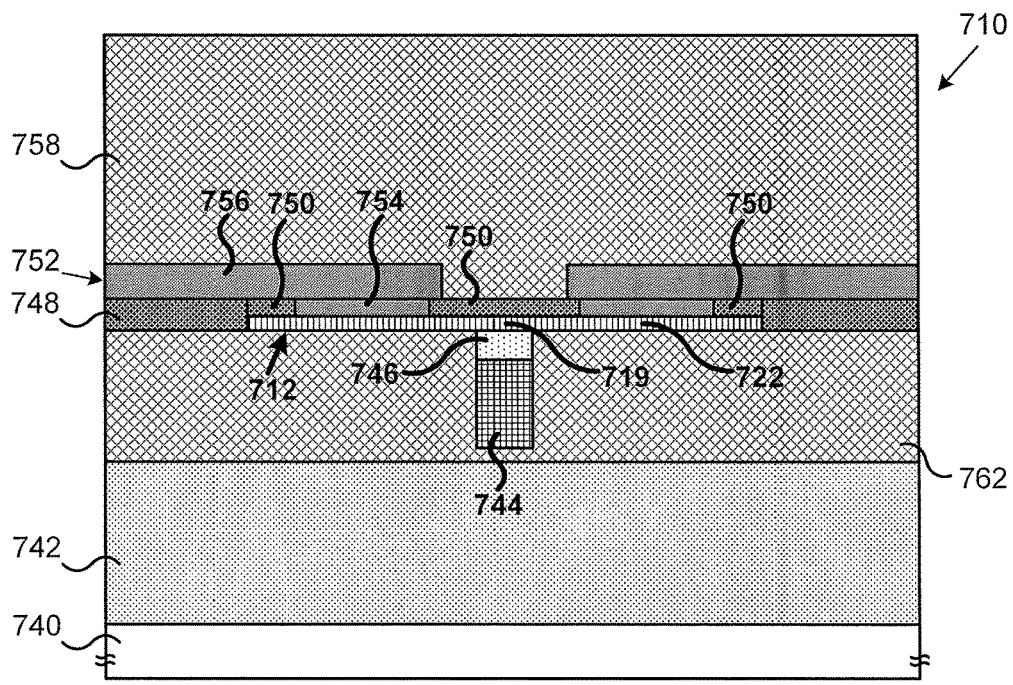
FIG. 7A illustrates a portion of an exemplary PCM RF switch according to one implementation of the present application.

FIG. 7A illustrates a portion of an exemplary PCM RF switch according to one implementation of the present application. As illustrated in FIG. 7A, PCM RF switch 710 includes substrate 740, heat spreader 742, heating element 744, nugget 746, PCM 712 having active segment 719 and passive segments 722, SiN segments 748 and 750, input/output contacts 752 having lower portions 754 and upper portions 756, dielectric 758, and thermally resistive material 762.

PCM RF switch 710 in FIG. 7A is similar to PCM RF switch 610 in FIG. 6A, except that PCM RF switch 710 in FIG. 7A includes thermally resistive material 762 extending along the width of the device, and heat spreader 742 is no longer situated under the passive segments 722 of PCM 712 and SiN segments 748. Unlike in FIGS. 3A through 5C, heat spreader 742 in FIG. 7A does not contact heating element 744 or any segment of PCM 712.

Figure 7B:
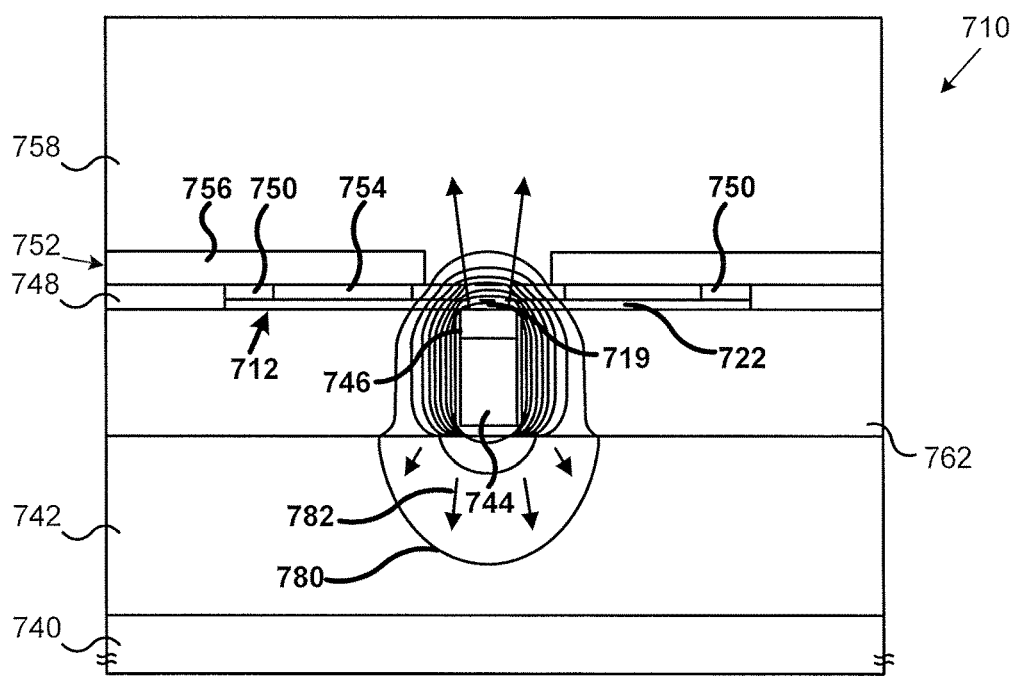
FIG. 7B is a diagram illustrating heat contours corresponding to the structure shown in PCM RF switch of FIG. 7A.

FIG. 7B is a diagram illustrating thermal or heat contours corresponding to the structure shown in PCM RF switch 710 of FIG. 7A. As illustrated in FIG. 7B, PCM RF switch 710 includes substrate 740, heat spreader 742, heating element 744, nugget 746, PCM 712 having active segment 719 and passive segments 722, SiN segments 748 and 750, input/ output contacts 752 having lower portions 754 and upper portions 756, dielectric 758, and thermally resistive material 762, all corresponding to like structures and elements shown in FIG. 7A. FIG. 7B illustrates heat contours 780 and heat flux arrows 782, in response to a heat pulse generated by heating element 744. Each heat contour 780 is an isotherm and represents an area of PCM RF switch 710 having substantially equal temperature during the heat pulse. The size and direction of heat flux arrows 782 generally correspond to the magnitude and direction of heat flux along heat contours 780.

As shown by heat contours 780 and heat flux arrows 782 in FIG. 7B, PCM RF switch 710 significantly restricts horizontal heat dissipation from the sides of heating element 744 as compared to PCM RF switch 610 in FIG. 6B. In other words, heat contours 780 are narrower around heating element 744. Because PCM RF switch 710 includes thermally resistive material 762 along the width of the device, more heat dissipates vertically from heating element 744, both toward active segment 719 of PCM 712 and toward heat spreader 742. The increased heat dissipation toward active segment 719 of PCM 712 enables active segment 719 of PCM 712 to reach even higher temperatures for the same applied pulse power. Additionally, the increased heat dissipation toward heat spreader 742 is particularly useful to counteract the fact that thermally resistive material 762 under heating element 744 (or heat valve) slightly reduces heat dissipation to heat spreader 742. Thus, the increased heat dissipation toward heat spreader 742 enables heat spreader 742 to cool PCM RF switch 710 more efficiently. Further, the restriction of horizontal heat dissipation reduces heating of passive segments 722 and input/output contacts 752 overlying thermally resistive material 762 which would otherwise be caused by heating element 744. Thus, it is less necessary to increase the width of PCM 712 and the spacing of input/output contacts 752 (which could detrimentally increase $R_{ON}$) in order to reduce thermal cycling consequences to these structures.

Figure 7C:
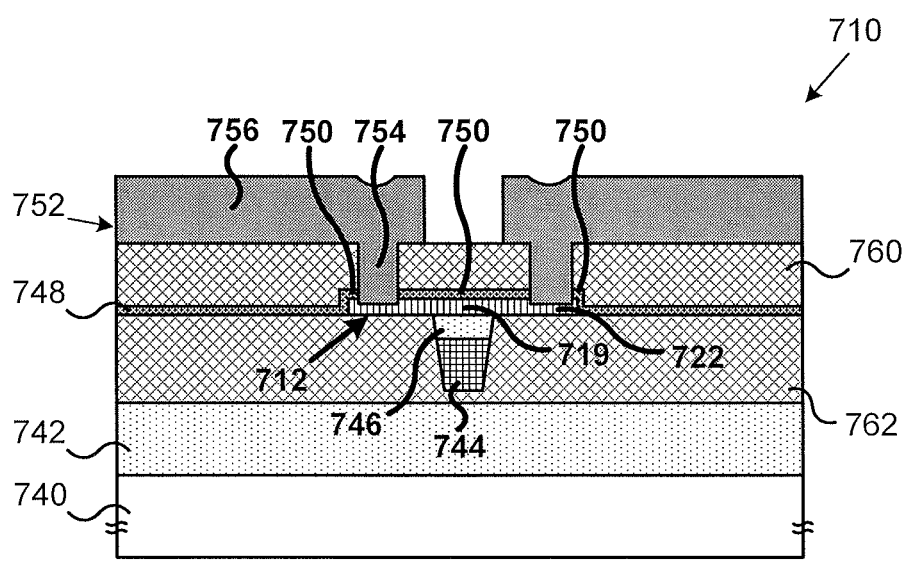
FIG. 7C illustrates a portion of an exemplary PCM RF switch according to one implementation of the present application.

FIG. 7C illustrates a portion of an exemplary PCM RF switch according to one implementation of the present application. As illustrated in FIG. 7C, PCM RF switch 710 includes substrate 740, heat spreader 742, heating element 744, nugget 746, PCM 712 having active segment 719 and passive segments 722, SiN segments 748 and 750, input/output contacts 752 having lower portions 754 and upper portions 756, dielectric 760, and thermally resistive material 762. PCM RF switch 710 in FIG. 7C generally corresponds to PCM RF switch 710 in FIGS. 7A and 7B, and is more closely suited for manufacturing and practical implementations.

Figure 8A:
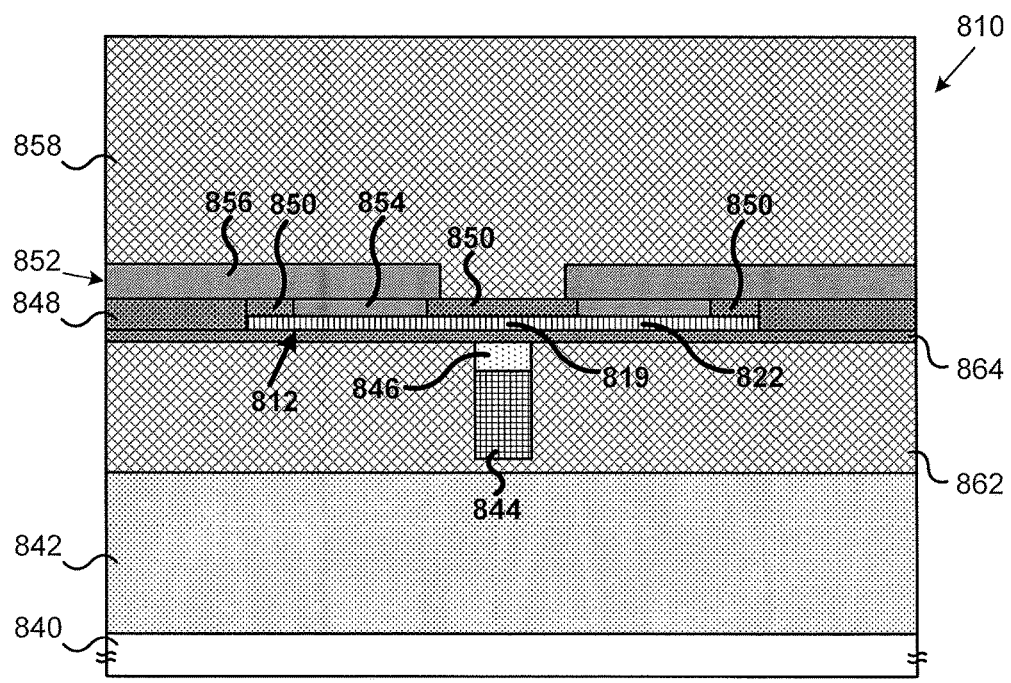
FIG. 8A illustrates a portion of an exemplary PCM RF switch according to one implementation of the present application.

FIG. 8A illustrates a portion of an exemplary PCM RF switch according to one implementation of the present application. As illustrated in FIG. 8A, PCM RF switch 810 includes substrate 840, heat spreader 842, heating element 844, nugget 846, PCM 812 having active segment 819 and passive segments 822, SiN segments 848 and 850, input/output contacts 852 having lower portions 854 and upper portions 856, dielectric 858, thermally resistive material 862, and SiN segment 864.

PCM RF switch 810 in FIG. 8A is similar to PCM RF switch 710 in FIG. 7A, except that PCM RF switch 810 in FIG. 8A includes SiN segment 864 under PCM 812. SiN segment 864 avoids non-conformities in PCM 812 that would otherwise occur when PCM 812 is situated over a non-homogeneous surface. By using SiN segment 864, PCM 812 is situated over a homogenous surface, thereby allowing PCM 812 to be substantially uniform with respect to that surface. If SiN segment 864 under PCM 812 were not used, PCM 812 would be situated over a non-homogeneous surface of nugget 846 and thermally resistive material 862, and non-conformities in PCM 812 are likely to occur, particularly around interfaces of nugget 846 and thermally resistive material 862. Accordingly, SiN segment 864 may be referred to as a conformability support layer in the present application. In one implementation, SiN segment 864 can have a thickness of approximately fifty angstroms to approximately five hundred angstroms (50 Å-500 Å).

Figure 8B:
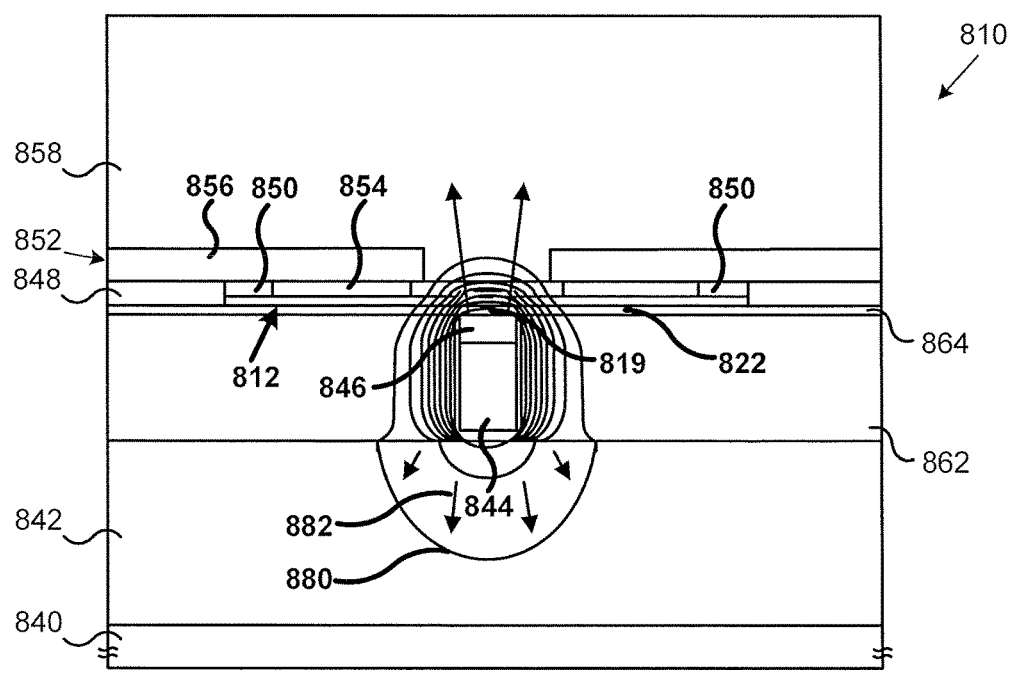
FIG. 8B is a diagram illustrating heat contours corresponding to the structure shown in PCM RF switch of FIG. 8A.

FIG. 8B is a diagram illustrating thermal or heat contours corresponding to the structure shown in PCM RF switch 810 of FIG. 8A. As illustrated in FIG. 8B, PCM RF switch 810 includes substrate 840, heat spreader 842, heating element 844, nugget 846, PCM 812 having active segment 819 and passive segments 822, SiN segments 848 and 850, input/output contacts 852 having lower portions 854 and upper portions 856, dielectric 858, thermally resistive material 862, and SiN segment 864, all corresponding to like structures and elements shown in FIG. 8A. FIG. 8B illustrates heat contours 880 and heat flux arrows 882, in response to a heat pulse generated by heating element 844. Each heat contour 880 is an isotherm and represents an area of PCM RF switch 810 having substantially equal temperature during the heat pulse. The size and direction of heat flux arrows 882 generally correspond to the magnitude and direction of heat flux along heat contours 880.

As shown by heat contours 880 and heat flux arrows 882 in FIG. 8B, including SiN segment 864 (SiN segment 864 also referred to as conformability support layer 864 in the present application) under PCM 812 in PCM RF switch 810 has no significant impact on the thermal profile of PCM RF switch 810. PCM RF switch 810 in FIG. 8B has substantially the same thermal advantages described above with respect to PCM RF switch 710 in FIG. 7B. Horizontal heat dissipation from heating element 844 is significantly restricted, enabling more efficient heating of active segment 819, more efficient cooling by heat spreader 842, and reduced heating of passive segments 822 and input/output contacts 852. Further, vertical heat dissipation from heating element 844 is heavily biased toward active segment 819 of PCM 812, enabling active segment 819 of PCM 812 can reach even higher temperatures for the same applied pulse power.

Figure 8C:
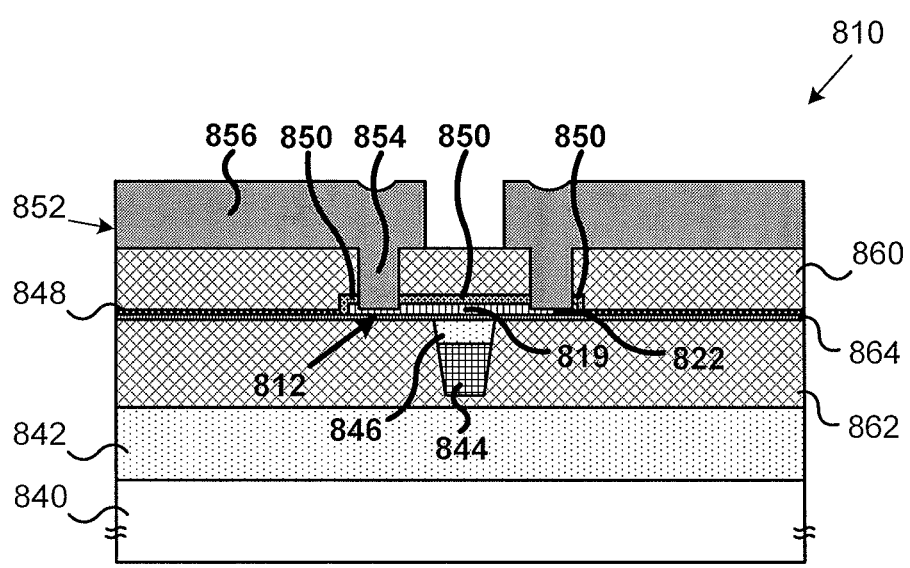
FIG. 8C illustrates a portion of an exemplary PCM RF switch according to one implementation of the present application.

FIG. 8C illustrates a portion of an exemplary PCM RF switch according to one implementation of the present application. As illustrated in FIG. 8C, PCM RF switch 810 includes substrate 840, heat spreader 842, heating element 844, nugget 846, PCM 812 having active segment 819 and passive segments 822, SiN segments 848 and 850, input/output contacts 852 having lower portions 854 and upper portions 856, dielectric 860, thermally resistive material 862, and SiN segment 864. PCM RF switch 810 in FIG. 8C generally corresponds to PCM RF switch 810 in FIGS. 8A and 8B, and is more closely suited for manufacturing and practical implementations.

Figure 9A:
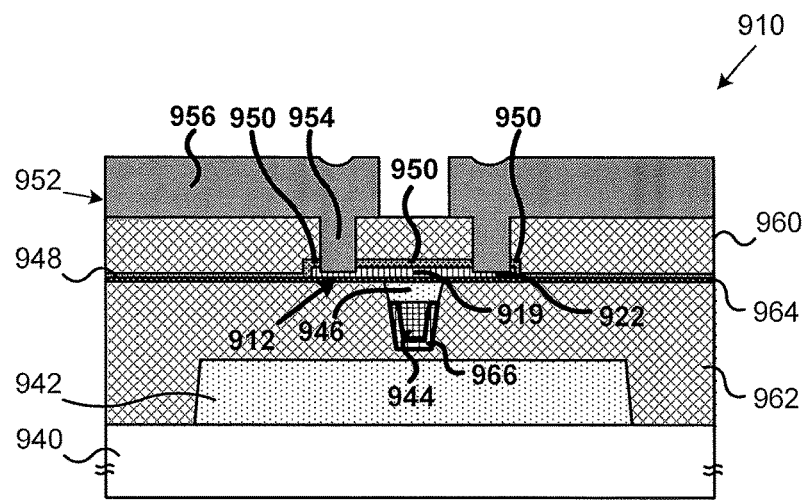
FIG. 9A illustrates a portion of an exemplary PCM RF switch according to one implementation of the present application.

FIG. 9A illustrates a portion of an exemplary PCM RF switch according to one implementation of the present application. As illustrated in FIG. 9A, PCM RF switch 910 includes substrate 940, heat spreader 942, heating element 944, nugget 946, PCM 912 having active segment 919 and passive segments 922, SiN segments 948 and 950, input/output contacts 952 having lower portions 954 and upper portions 956, thermally resistive material 962, SiN segment 964, and liner 966.

In PCM RF switch 910, outer segments of heat spreader 942 are etched away. Thermally resistive material 962 is situated on sides of heat spreader 942, and over substrate 940. In one implementation, plasma dry etching is used for anisotropic etching of heat spreader 942. In one implementation, the anisotropic etching leaves stress-relieving chamfers (not shown) on sides or corners of heat spreader 942. In implementations where heat spreader 942 comprises high-stress material, such as AlN, using thermally resistive material 962 on sides of heat spreader 942 together with chamfers provides effective stress-relief.

As shown in FIG. 9A, PCM RF switch 910 can optionally include liner 966 around heating element 944. Nugget 946 can be situated over heating element 944 and liner 966, so that nugget 946 directly transfers heat from the top of heating element. In one implementation, liner 966 can comprise $SiO_2$. In one implementation, liner 966 can have a thickness of approximately two hundred angstroms to approximately five hundred angstroms (200 Å-500 Å).

Figure 9B:
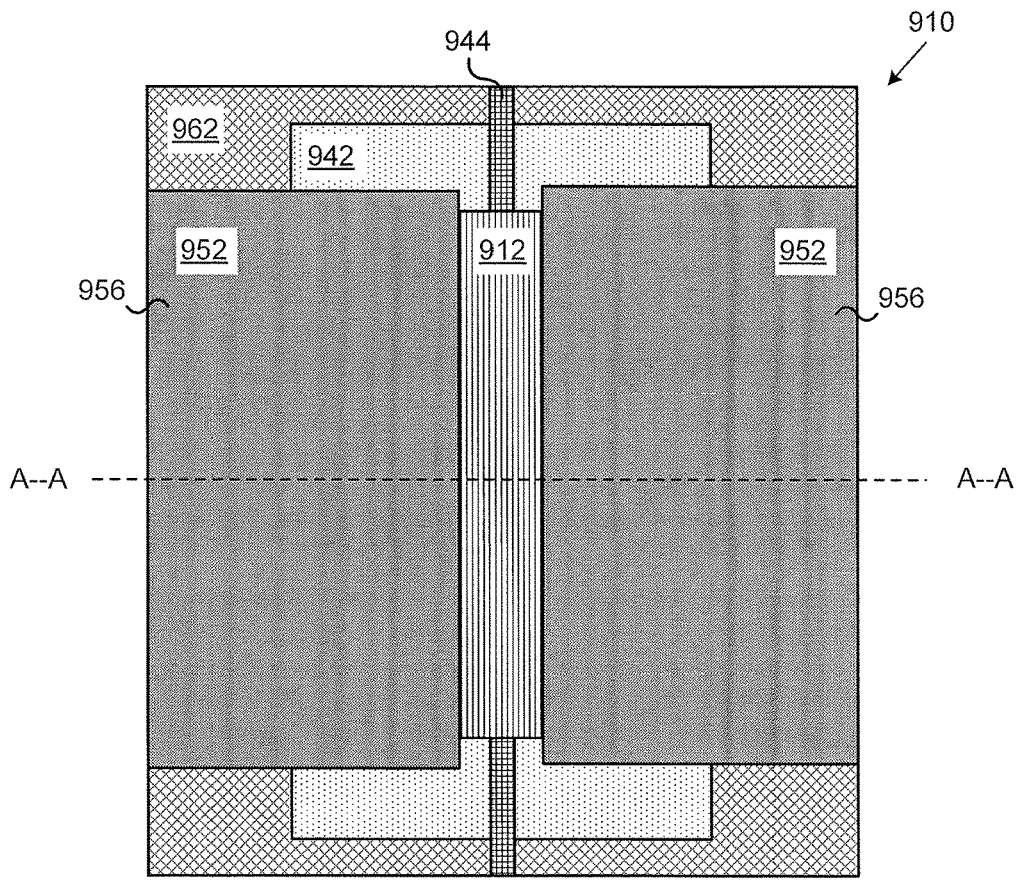

FIG. 9B shows a top view of PCM RF switch 910 of FIG. 9A. FIG. 9A represents a cross-sectional view along line "A-A" in FIG. 9B. The top view in FIG. 9B shows PCM RF switch 910 as seen through various layers, such as seen through SiN segments 950 and dielectric 960. As such, portions of top views of thermally resistive material 962, heat spreader 942, heating element 944, PCM 912, and input/output contacts 952, and more specifically upper portions 956 of input/output contacts 952, are shown.

PCM RF switches, such as PCM RF switch 810, employing phase-change material as disclosed in the present application exhibit improved reliability, thermal management, and overall performance. For example, because nugget 846 is situated on top of heating element 844 and aligned therewith, nugget 846 efficiently transfers heat to PCM 812. Controlling heat is crucial to efficiently and effectively transform the state of PCM 812, as discussed above. In PCM RF switch 810, PCM 812 can reach high temperatures quickly and with low applied pulse power. Moreover, heat spreader 842 enables PCM RF switch 810 to efficiently quench PCM 812 as needed.

In addition, in PCM RF switch 810, active segment 819 of PCM 812 can be substantially restricted to an area overlying nugget 846. Because PCM transformation is limited to active segment 819, the entire PCM 812 does not change its state. PCM 812 exhibits less thermal cycling, increasing its lifetime. PCM 812 also requires less applied pulse power to heat the smaller area, allowing for low voltage applications. Because passive segments 822 are situated approximately under input/output contacts 852, input/output contacts 852 are also subject to less thermal cycling and thus, less variation in resistance, and less possibility of damage. As a corollary, because thermally resistive material 862 is adjacent to sides of heating element 844, the "width" of PCM 812 (analogous to a small channel length in a conventional transistor or switch) can be kept small without exposing contacts or passive regions to thermal cycling. Thus, $R_{ON}$ of PCM RF switch 810 can be decreased.

Because PCM RF switch 810 includes PCM 812, PCM RF switch 810 can exploit transformative properties, advantageously allowing very low $R_{ON}$ and very high $R_{OFF}$. SiN segment 864 under PCM 812 reduces non-conformities in PCM 812, improving reliability (SiN segment 864 are also referred to as conformability support layer 864 in the present application). Keeping PCM 812 undamaged using SiN segments 850 enables more uniform contact between lower portions 854 of input/output contacts 852 and PCM 812, further reducing $R_{ON}$ of PCM RF switch 810 (SiN segments 850 also referred to as contact uniformity support layer 864 in the present application).

Because nugget 846 comprises electrically insulating material, nugget 846 prevents electrical signals from leaking out from the path between input/output contacts 852 to heating element 844 or other lower components. The added thickness of nugget 846 also reduces parasitic capacitance between input/output contacts 852 and heating element 844, reducing $C_{OFF}$ of PCM RF switch 810.

Thus, various implementations of the present application achieve PCM RF switches that overcomes the deficiencies in the art. From the above description it is manifest that various techniques can be used for implementing the concepts described in the present application without departing from the scope of those concepts. Moreover, while the concepts have been described with specific reference to certain implementations, a person of ordinary skill in the art would recognize that changes can be made in form and detail without departing from the scope of those concepts. As such, the described implementations are to be considered in all respects as illustrative and not restrictive. It should also be understood that the present application is not limited to the particular implementations described above, but many rearrangements, modifications, and substitutions are possible without departing from the scope of the present disclosure.

The invention claimed is:

1. A radio frequency (RF) switch comprising:
a heating element;
a thermally resistive material adjacent to first and second sides of said heating element;
a heat valve under said heating element;
a heat spreader under said heat valve and over a substrate;
a nugget comprising a thermally conductive and electrically insulating material situated on top of said heating element;
a phase-change material having an active segment situated approximately over said nugget and passive segments situated approximately under input/output contacts of said RF switch.

2. The RF switch of claim 1, wherein said phase-change material is selected from the group consisting of germanium telluride ($Ge_xTe_y$), germanium antimony telluride ($Ge_xSb_yTe_z$), germanium selenide ($Ge_xSe_y$), and any other chalcogenide.

3. The RF switch of claim 1, wherein said thermally resistive material is adjacent to first and second sides of said nugget.

4. The RF switch of claim 1, wherein said heat spreader comprises aluminum nitride (AlN).

5. The RF switch of claim 1, wherein said thermally resistive material is under said heating element and performs as said heat valve.

6. The RF switch of claim 1, wherein said passive segments of said phase-change material are situated approximately over said thermally resistive material.

7. The RF switch of claim 1, wherein said thermally conductive and electrically insulating material comprises aluminum nitride (AlN).

8. The RF switch of claim 1, wherein said heating element comprises tungsten (W).

9. The RF switch of claim 1, further comprising a segment of silicon nitride under said phase-change material.

10. The RF switch of claim 9, further comprising another segment of silicon nitride over said phase-change material.

11. A radio frequency (RF) switch comprising:
a heating element;
a heat valve under said heating element;
a heat spreader under said heat valve and over a substrate;

a nugget comprising a thermally conductive and electrically insulating material situated on top of said heating element;

a phase-change material having an active segment situated approximately over said nugget and passive segments situated approximately under input/output contacts of said RF switch.

12. The RF switch of claim 11, wherein said phase-change material is selected from the group consisting of germanium telluride ($Ge_XTe_Y$), germanium antimony telluride ($Ge_XSb_Y$-$Te_Z$), germanium selenide ($Ge_XSe_Y$), and any other chalcogenide.

13. The RF switch of claim 11, wherein said thermally conductive and electrically insulating material comprises aluminum nitride (AlN), and wherein said heating element comprises tungsten (W).

14. The RF switch of claim 11, further comprising a segment of silicon nitride under said phase-change material.

15. The RF switch of claim 14, further comprising another segment of silicon nitride over said phase-change material.

* * * * *